(12) United States Patent
Soules et al.

(10) Patent No.: US 6,252,254 B1
(45) Date of Patent: Jun. 26, 2001

(54) LIGHT EMITTING DEVICE WITH PHOSPHOR COMPOSITION

(75) Inventors: Thomas Frederick Soules, Richmond Heights; William Winder Beers, Chesterland, both of OH (US); Alok Mani Srivastava, Schenectady, NY (US); Lionel Monty Levinson; Anil Raj Duggal, both of Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/203,212

(22) Filed: Nov. 30, 1998

Related U.S. Application Data

(63) Continuation-in-part of application No. 09/019,647, filed on Feb. 6, 1998, now abandoned.

(51) Int. Cl.$^7$ ................ H01L 33/00; H01J 1/62
(52) U.S. Cl. ............... 257/89; 257/98; 257/100; 313/501; 313/502; 313/503
(58) Field of Search ................ 257/88, 89, 98, 257/99, 100, 103; 313/501, 502, 503

(56) References Cited

U.S. PATENT DOCUMENTS

| | | | |
|---|---|---|---|
| 3,787,684 | 1/1974 | Isenberg | 250/71 R |
| 3,819,974 | 6/1974 | Stevenson et al. | 313/499 |
| 4,176,294 | * 11/1979 | Thornton, Jr. | 313/503 |
| 4,769,292 | 9/1988 | Tang et al. | 428/690 |
| 4,950,950 | 8/1990 | Perry et al. | 313/504 |

(List continued on next page.)

FOREIGN PATENT DOCUMENTS

| | | |
|---|---|---|
| 3406798 | 8/1985 | (DE) . |
| 19638667 | 4/1998 | (DE) . |
| 19756360 | 9/1998 | (DE) . |
| 5152609 | 6/1993 | (JP) . |
| 10012925 | 1/1998 | (JP) . |
| 1012916 | 1/1998 | (JP) . |

(List continued on next page.)

OTHER PUBLICATIONS

R. K. Datta, "Bismuth in Yttrium Vanadate and Yttrium Europium Vanadate Phosphors," J. Electrochem. Soc: Solid State Science, vol. 114, No. 10, Oct. 1967, pp. 1057–1063.

S. Z. Toma et al., "Energy Transfer and Fluorescence Processes in Bi3+ and Eu3+ Activated YVO4", J. Electrochem. Soc.: Solid State Science, vol. 114, No. 9, Sep. 1967, pp. 953–955.

Y. Sato, N. Takahashi and S. Sato, "Full–Color Fluorescent Display Devices Using a Near–UV Light–Emitting Diode" Jpn. Appl. Phys. vol. 35 (1996) pp. L838–L839, Part 2. No. 7A, Jul. 7, 1996.

(List continued on next page.)

*Primary Examiner*—Minh Loan Tran
(74) *Attorney, Agent, or Firm*—Toan B. Vo; Noreen C. Johnson

(57) ABSTRACT

The invention relates to a light source comprising a phosphor composition and a light emitting device such as an LED or a laser diode. The phosphor composition absorbs radiation having a first spectrum and emits radiation having a second spectrum and comprises at least one of: $YBO_3:Ce^{3+}$, $Tb^{3+}$; $BaMgAl_{10}O_{17}:Eu^{2+},Mn^{2+}$; $(Sr,Ca,Ba)(Al,Ga)_2S_4:Eu^{2+}$; and $Y_3Al_5O_{12}$—$Ce^{3+}$; and at least one of: $Y_2O_2S:Eu^{3+},Bi^{3+}$; $YVO_4:Eu^{3+},Bi^{3+}$; $SrS:Eu^{2+}$; $SrY_2S_4:Eu^{2+}$; $CaLa_2S_4:Ce^{3+}$; and $(Ca,Sr)S:Eu^{2+}$. The phosphor composition and the light source together can produce white light with pleasing characteristics, such as a color temperature of 3000–6500° K, a color rendering index of about 83–87, and a device luminous efficacy of about 10–20 lumens per watt.

13 Claims, 2 Drawing Sheets

U.S. PATENT DOCUMENTS

| | | | |
|---|---|---|---|
| 5,027,168 | 6/1991 | Edmond | 357/17 |
| 5,126,214 | 6/1992 | Tokailin et al. | 428/690 |
| 5,187,547 | 2/1993 | Niina et al. | 257/77 |
| 5,230,831 | 7/1993 | Srivastava | 252/301.4 F |
| 5,294,870 | 3/1994 | Tang et al. | 313/504 |
| 5,338,944 | 8/1994 | Edmond et al. | 257/76 |
| 5,416,342 | 5/1995 | Edmond et al. | 257/76 |
| 5,535,230 | 7/1996 | Abe | 372/43 |
| 5,578,839 | 11/1996 | Nakamura et al. | 257/96 |
| 5,583,879 | 12/1996 | Yamazaki et al. | 372/560 |
| 5,604,763 | 2/1997 | Kato et al. | 372/45 |
| 5,644,584 | 7/1997 | Nam et al. | 372/20 |
| 5,683,823 | 11/1997 | Shi et al. | 428/690 |
| 5,705,047 | 1/1998 | Lee | 205/123 |
| 5,717,289 | 2/1998 | Tanaka | 313/503 |
| 5,743,629 | 4/1998 | Helstern et al. | 362/293 |
| 5,813,752 | 9/1998 | Singer et al. | 362/293 |
| 5,813,753 | 9/1998 | Vriens et al. | 362/293 |
| 5,815,228 | 9/1998 | Flynn | 349/71 |
| 5,821,569 | 10/1998 | Dutta | 257/96 |
| 5,847,507 | 12/1998 | Butterworth et al. | 313/512 |
| 5,848,837 | 12/1998 | Gustafson | 362/235 |
| 5,851,905 | 12/1998 | McIntosh et al. | 438/492 |
| 5,865,529 | 2/1999 | Yan | 362/327 |
| 5,874,803 | 2/1999 | Garbuzov et al. | 313/506 |
| 5,959,316 | 9/1999 | Lowery | 257/98 |
| 5,962,971 | 10/1999 | Chen | 313/512 |
| 5,966,393 | 10/1999 | Hide et al. | 372/23 |
| 5,998,925 | 12/1999 | Shimizu et al. | 313/503 |

FOREIGN PATENT DOCUMENTS

| | | |
|---|---|---|
| 1022527 | 1/1998 | (JP) . |
| 10163535 | 6/1998 | (JP) . |
| 10170341 | 6/1998 | (JP) . |
| 9748138 | 12/1997 | (WO) . |
| 9750132 | 12/1997 | (WO) . |
| 9805078 | 2/1998 | (WO) . |
| 9812757 | 3/1998 | (WO) . |
| 9819290 | 5/1998 | (WO) . |
| 9839805 | 9/1998 | (WO) . |

OTHER PUBLICATIONS

G. Blasse and A. Bril, *Energy Transfer from $Ce^{3+}$ to $Tb^{3+}$ in Scandium Borate*, 3 J. Luminescence 18–20 (1970).

G. Blasse and B. C. Grabmaier, *Luminescent Materials* 10–38, 112–130 (1994).

*Phosphor Handbook*, 217–230, 433–444, 581–600, 899–921 (Shigeo Shionoya et al. eds., CRC Press 1999).

R. K Datta, *Empirical Studies on the Absorption and Emission of the Phosphor $YVO4:Eu$*, 239 Trans. of Metal. Soc. of AIME 355–359 (1967).

L. Eichenauer et al., *Optical Characterization of Europium and Cerium in Strontium Thiogallate Thin Films and Powders*, 153 Phys. Stat. Sol. 515–527 (1996).

R. Mach, *Thin Film Electroluminescence Devices*, Solid State Luminescence 229–262 (A.H. Kitai, Ed. 1993).

Shiju Nakamura and Gerhard Fasol, *The Blue Laser Diode*, 216–221 (1997).

R. C. Ropp. *Spectra of Some Rare Earth Vanadates*, 115 J. Electrochem Soc: Solid State Science 940–945 (1968).

Qinghua Zeng et al., *Luminescence and Its Temperature Effects on $Sm^{2+}$ in Alkaline Earth Borates*, 212 Phys. Stat. Sol. 207 219 (1999).

Enclyclopedia of Physical Science and Technology, vol. 7, 230–231 (Robert A. Meyers ed., 1987).

Keith Butler, Fluorescent Lamp Phosphors, vii–xi, 49–60, 115–130 (1980).

\* cited by examiner

LIGHT EMITTING DEVICE WITH PHOSPHOR COMPOSITION

This application is a continuation-in-part of U.S. Ser. No. 09/019,647, filed Feb. 6, 1999, abandoned.

BACKGROUND

1. Field of the Invention

This invention relates generally to light emitting devices, and more particularly to a light emitting diode (LED) or laser diode coated with phosphors.

2. Description of the Related Art

Solid state light sources have been available for many years. The colors have been predominantly red, orange, and green. Within the last several years blue LEDs have also been produced. The combination of red, green and blue LEDs has enabled the generation of white light with a complicated 4 lead package. However, the different LEDs have different lumen vs life curves causing the color to change with life. In the Fall of 1996, Nichia of Japan introduced a new white LED, Product No. NSPW310AS. This product uses yttrium aluminum garnet doped with cerium to convert blue emission from the LED into a very broad band yellow emission. The emission peak is at 580 nm with a full width at half maximum of 160 nm. The phosphor is coated directly on the LED. The entire device is encapsulated in a clear plastic lens. The emission contains enough orange emission to produce white light at a color temperature of about 8000° K, a color rendering index (CRI) of about 77, and a device luminous efficacy of approximately 5 lumens per watt (lm/w) of input electric power.

It is well know that tastes in lighting characteristics can vary by geographical region. For example, in some regions of the world, high color temperatures are preferred, while in other regions lower color temperatures are desired. Similarly, in some regions, CRIs in the mid-nineties are preferred, while in other regions CRIs in the mid-eighties are preferred. Hence, it is desirable to adapt the output characteristics of a lamp to suit particular preferences.

The color temperature of the white LED produced by Nichia can be lowered by using more phosphor, however, the system efficiency is also decreased. There is a need for a phosphor-coated LED having a higher device luminous efficacy; there is also a need for such an LED having a lower color temperature.

SUMMARY

A light-emitting device, according to an exemplary embodiment of the invention, comprises a blue-emitting LED covered with a phosphor-containing covering, the phosphor-containing covering containing green-emitting phosphors and red-emitting phosphors, said green and red phosphors being excitable by said blue-emitting LED.

The invention also relates to a phosphor composition which absorbs radiation having a first spectrum and emits radiation having a second spectrum and which comprises at least one of: $YBO_3:Ce^{3+},Tb^{3+}$; $BaMgAl_{10}O_{17}:Eu^{2+},Mn^{2+}$; $(Sr,Ca,Ba)(Al,Ga)_2S_4:Eu^{2+}$; and $Y_3Al_5O_{12}:Ce^{3+}$; and at least one of: $Y_2O_2S:Eu^{3+},Bi^{3+}$; $YVO_4:Eu^{3+},Bi^{3+}$; $SrS:Eu^{2+}$; $SrY_2S_4:Eu^{2+}$; $(Ca,Sr)S:Eu^{2+}$; and $CaLa_2S_4:Ce^{3+}$ (where the element following the colon represents an activator).

The invention also relates to a novel phosphor composition comprising $Y_2O_2S:Eu^{3+},Bi^{3+}$.

The invention also relates to a novel phosphor composition comprising $YVO_4:Eu^{3+},Bi^{3+}$.

The invention also relates to a lamp comprising a phosphor composition and a light emitting device such as an LED or laser diode. The LED or laser diode emits radiation having a first spectrum, at least a portion of which is absorbed by the phosphor composition. The phosphor composition emits radiation having a second spectrum and comprises at least one of: $YBO_3:Ce^{3+},Tb^{3+}$; $BaMgAl_{10}O_{17}:Eu^{2+},Mn^{2+}$; $(Sr,Ca,Ba)(Al,Ga)_2S_4:Eu^{2+}$; and $Y_3Al_5O_{12}$—$Ce^{3+}$; and at least one of: $Y_2O_2S:Eu^{3+},Bi^{3+}$; $YVO_4:Eu^{3+},Bi^{3+}$; $SrS:Eu^{2+}$; $SrY_2S_4:Eu^{2+}$; $(Ca,Sr)S:Eu^{2+}$; and $CaLa_2S_4:Ce^{3+}$.

The invention also relates to a light emitting device comprising a blue emitting LED and a phosphor composition comprising $SrS:Eu^{2+},Ce^{3+},K^+$. The $SrS:Eu^{2+},Ce^{3+},K^+$ phosphor, when excited by blue light, emits a broadband spectrum including red light and green light.

The invention also relates to a method of producing white light comprising the steps of generating light, directing the light to a phosphor composition comprising at least one of: $YBO_3:Ce^{3+},Tb^{3+}$; $BaMgAl_{10}O_{17}:Eu^{2+},Mn^{2+}$; $(Sr,Ca,Ba)(Al,Ga)_2S_4:Eu^{2+}$; and $Y_3Al_5O_{12}$—$Ce^{3+}$; and at least one of: $Y_2O_2S:Eu^{3+},Bi^{3+}$; $YVO_4:Eu^{3+},Bi^{3+}$; $SrS:Eu^{2+}$; $SrY_2S_4:Eu^{2+}$; $(Ca,Sr)S:Eu^{2+}$; and $CaLa_2S_4:Ce^{3+}$; and converting at least a portion of the light with the phosphor composition to light having a different spectrum.

The phosphor composition and the light source together can produce white light with pleasing characteristics, such as a color temperature of 3000–4100° K, a color rendering index of greater than 70, typically greater than 80, for example about 83–87, and a device luminous efficacy of about 10–20 lumens per watt of input electric power.

BRIEF DESCRIPTION OF THE DRAWINGS

Other features and advantages of the invention will be apparent from the following detailed description and the accompanying drawings, in which.

DETAILED DESCRIPTION OF THE PREFERRED EMBODIMENTS

Figure 1:
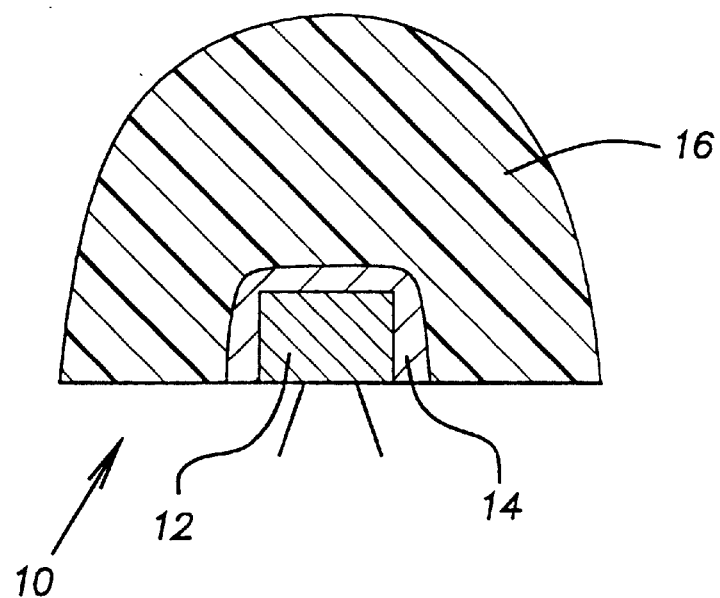
FIG. 1 is a schematic elevational view in cross-section of a phosphor-coated LED of the present invention.

Parts are parts by weight and percents are weight percents unless otherwise indicated or apparent. When a preferred range such as 5–25 is given, this means preferably at least 5 and preferably not more than 25.

Some of the more important parameters used to describe the output spectrum of a light source are the color temperature, the color rendering index, and the device luminous efficacy. The color temperature of an output spectrum is not an exact representation of the color of a light source. The color temperature of a light source refers to the temperature of a blackbody source having the closest color match to the light source in question. The color match is typically represented and compared on a conventional CIE (Commission International de l'Eclairage) chromaticity diagram. See, for example, "Encyclopedia of Physical Science and Technology", vol. 7, 230–231 (Robert A. Meyers ed., 1987). Generally, as the color temperature increases, the light becomes more blue. As the color temperature decreases, the light appears more red.

The color rendering index (CRI) is a measure of the degree of distortion in the apparent colors of a set of standard pigments when measured with the light source in question as opposed to a standard light source. The CRI can be determined by calculating the color shift, e.g. quantified as tristimulus values, produced by the light source in question as opposed to the standard light source. Typically, for color temperatures below 5000° K, the standard light source used is a blackbody of the appropriate temperature. For color temperatures greater than 5000° K, sunlight is typically used as the standard light source. Light sources having a relatively continuous output spectrum, such as incandescent lamps, typically have a high CRI, e.g. equal to or near 100. Light sources having a multi-line output spectrum, such as high pressure discharge lamps, typically have a CRI ranging from about 50 to 80. Fluorescent lamps typically have a CRI greater than about 60.

The device luminous efficacy is defined as the luminous flux output by the lamp divided by the electric power input to the lamp. The device luminous efficacy of the lamp takes into account the spectral luminous efficacy (luminous flux out divided by radiant power in), the device efficiency (radiant power output by the LED divided by electric power input to the LED), the quantum efficiency of the phosphor composition (number of photons emitted by the phosphor divided by the number of photons absorbed by the phosphor), and the energy loss associated with the decrease in frequency of the emitted light (equal to hΔv, where h is Plank's constant and Δv is the change in frequency of the light).

Exemplary embodiments of the present invention include an LED and a phosphor composition which together produce white light having pleasing characteristics. For example, the LED and phosphor composition can produce light having color temperatures between 3000° K and 6500° K, among other temperatures, for example 3000, 3500, 4100, 5000, and 6500° K. The exemplary phosphor compositions can also produce a relatively high CRI, e.g. typically greater than 70, preferably greater than 80, e.g. 83–87, and a high device luminous efficacy, e.g., 10–20 lumens per watt or more of input electric power.

Figure 2:
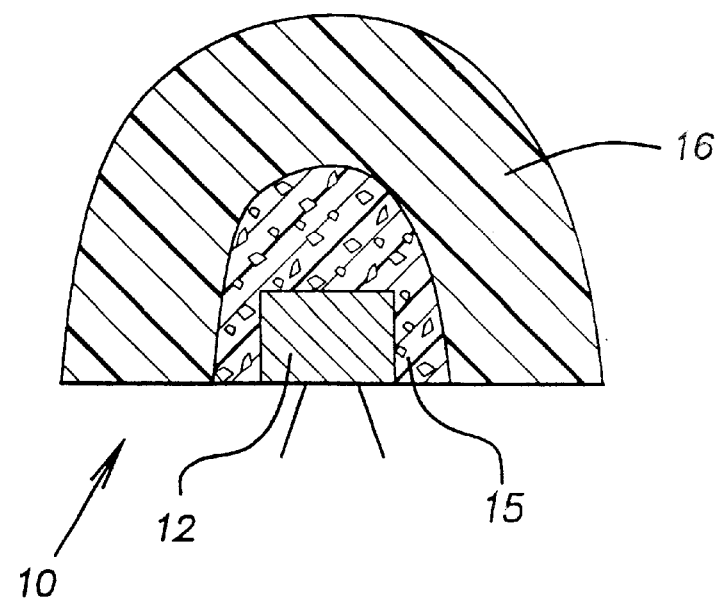
FIG. 2 is a schematic elevational view in cross-section of a phosphor-coated LED of the present invention.

With reference to FIG. 1, there is shown a phosphor-coated LED or light-emitting device 10 having a blue-emitting LED 12 covered with a phosphor-containing layer or covering 14 (a phosphor coating directly on the LED), and a clear polymer lens 16. With reference to FIG. 2, there is shown a phosphor-coated LED or light-emitting device 10 having a blue-emitting LED 12 covered with a phosphor-containing layer or covering 15 (phosphors embedded in polymer), and a clear polymer lens 16 molded over layer 15. The lens 16 may also be a diffuse lens which scatters light propagating through it. The lens 16 and the layer 15 may also comprise a silicone material, for example.

Blue-emitting LED 12 has an emission peak at 420–470, more typically 430–460, more typically 440–450, optionally about 450–470, nm, typically with a full width at half maximum of not more than 70, more typically 50, more typically 30, nm. Blue-emitting LEDs of this type are known in the art, a preferred example thereof is available from Nichia of Japan as Product No. NSCB100. LED 12 preferably has a device efficiency (radiant power out of LED divided by electric power in) of at least 4%, more preferably 6%, more preferably 8%. Blue-emitting LEDs are generally known in the art.

According to one example of the invention, a combination of two blue-excited phosphors (excited by the blue emission from LED 12), one emitting in the green and one emitting in the red, is used in place of the yellow emitting yttrium aluminum garnet of the Nichia product mentioned above. Because these new emissions are close to peaks in the tristimulus functions in combination with the blue from the LED they produce light with higher luminous efficacy and better color rendering than the phosphors used in prior devices. These green and red phosphors are selected so that they are excited by the blue-emitting LED. The green color-emitting phosphor typically has an emission peak at 510–560, more typically 530–555, more typically 540–550, for example about 545, nm, with a full width at half maximum of not more than 60, typically not more than 50, 35, 20, 10, or 5, nm. The red color-emitting phosphor typically has an emission peak at 600–630, more typically 610–625, more typically 610–615, optionally about 611, nm, with a full width at half maximum of not more than 100, typically not more than 60, 50, 20, 10, or 5, nm. The phosphor-containing layers 14 and 15 contain these green color-emitting phosphors and red color-emitting phosphors. These phosphors typically have preferred particle size of 2–5 micrometers.

One example of a phosphor composition comprises at least one of the following green-emitting phosphors: $YBO_3:Ce^{3+},Tb^{3+}$; $BaMgAl_{10}O_{17}:Eu^{2+},Mn^{2+}$; and $(Sr,Ca,Ba)(Al,Ga)_2S_4:Eu^{2+}$; in combination with at least one of the following red-emitting phosphors: $Y_2O_2S:Eu^{3+},Bi^{3+}$; $YVO_4:Eu^{3+},Bi^{3+}$; $SrS:Eu^{2+}$; $SrY_2S_4:Eu^{2+}CaLa_2S_4:Ce^{3+}$; and $(Ca,Sr)S:Eu^{2+}$.

In the above phosphors, the element following the colon represents an activator. The notation (A,B,C) signifies ($A_x$, $B_y$, $C_z$) where $0 \leq x \leq 1$ and $0 \leq y \leq 1$ and $0 \leq z \leq 1$ and $x+y+z=1$. For example, (Sr,Ca,Ba) signifies ($Sr_x,Ca_y,Ba_z$) where $0 \leq x \leq 1$ and $0 \leq y \leq 1$ and $0 \leq z \leq 1$ and $x+y+z=1$. Typically, x, y, and z are all nonzero. The notation (A,B) signifies ($A_x,B_y$) where $0 \leq x \leq 1$ and $0 \leq y \leq 1$ and $x+y=1$. Typically, x and y are both nonzero.

The green-emitting phosphors, when excited by blue light, have the following characteristics: $YBO_3:Ce^{3+},Tb^{3+}$ has an emission peak at about 545 nm and a full width half maximum value of about 2 nm; $BaMgAl_{10}O_{17}:Eu^{2+},Mn^{2+}$ has an emission peak at about 515 nm and a full width half maximum value of about 50 nm; and $(Sr,Ca,Ba)(Al,Ga)_2S_4:Eu^{2+}$ has an emission peak at about 540 nm and a full width half maximum value of about 50 nm.

The red-emitting phosphors, when excited by blue light, have the following characteristics: $Y_2O_2S:Eu^{3+},Bi^{3+}$ has an emission peak at about 620 nm and a full width half maximum value of about 2 nm; $YVO_4:Eu^{3+},Bi^{3+}$ has an emission peak at about 620 nm and a full width half maximum value of about 2 nm; $SrS:Eu^{2+}$ has an emission peak at about 610 nm and a full width half maximum value of about 70 nm; $(Ca,Sr)S:Eu^{2+}$ has an emission peak at about 610 nm and a full width half maximum value of about 50 nm; $SrY_2S_4:Eu^{2+}$ has an emission peak at about 645 nm and a full width half maximum value of about 100 nm; and $CaLa_2S_4:Ce^{3+}$, has an emission peak at about 600 nm and a full width half maximum value of about 100 nm.

The red and green phosphors are preferably blended in weight ratios such that combined with the blue emission of the LED, they produce suitable white light, e.g., about 45/20 (weight ratio of red to green) for white light at about 3000° K; about 42/22 at about 3500° K; about 34/25 at about 4100° K; about 27/25 at about 5000° K; and about 20/25 at about 6500° K. The desired emission can also be obtained from $Eu^{3+}$ (red) and $Tb^{3+}$ (green). Alternative activators include $Mn^{2+}$ and $Eu^{2+}$ for green emission.

The red phosphors $Y_2O_2S:Eu^{3+},Bi^{3+}$ and $YVO_4:Eu^{3+},Bi^{3+}$ have relatively narrow output spectra, e.g. full width half maximum values of less than about 5 nm, typically about 2 nm. The green phosphor $YBO_3:Ce^{3+},Tb^{3+}$ also has a relatively narrow output spectrum, e.g. a full width half maximum value of less than about 5 nm, typically about 2 nm. A combination of $Y_2O_2S:Eu^{3+},Bi^{3+}$ and/or $YVO_4:Eu^{3+},Bi^{3+}$ with $YBO_3:Ce^{3+},Tb^{3+}$ provides a phosphor composition which efficiently converts blue light into luminous flux. The efficiency of these phosphors is related to the variable sensitivity of the eye to different wavelengths of light. In the red region of the spectrum, the sensitivity of the eye drops off sharply at wavelengths greater than about 650 nm. Broad band red phosphors may have an emission spectrum with an appreciable portion of the emission greater than 650 nm where the eye is not sensitive. With sharp line red phosphors such as $Y_2O_2S:Eu^{3+},Bi^{3+}$ and $YVO_4:Eu^{3+},Bi^{3+}$, substantially all of the emission spectrum lies within the most sensitive region of the eye for red light, producing a higher luminous flux than a broad band red phosphor. In general, the sensitivity of the eye in the green wavelengths does not drop off as rapidly as in the red wavelengths, so that it is less important to have a green phosphor with a sharp line emission. However, a phosphor such as $YBO_3:Ce^{3+},Tb^{3+}$ which has a sharp line emission near the most sensitive green region of the spectrum (555 nm) also efficiently produces luminous flux.

The red emitting phosphor $YVO_4:Eu^{3+},Bi^{3+}$ can be prepared by combining stoichiometric amounts of $Y_2O_3$, $Eu_2O_3$, $Bi_2O_3$, and $V_2O_5$ and milling in a ball mill for about 2 hours. The mixture is then air fired in a furnace at about 1000° C. for about 10 hours. The inclusion of bismuth increases the wavelength of light which is absorbed by the phosphor, such that blue light is absorbed.

The red emitting phosphor $Y_2O_2S:Eu^{3+},Bi^{3+}$ can be prepared by combining stoichiometric amounts of $Y_2O_3$, $Eu_2O_3$, and $Bi_2O_3$, and milling in a ball mill for about 2 hours. The mixture is then heated in an atmosphere of $H_2S$ at about 1000° C. for about 3 hours. The inclusion of bismuth increases the wavelength of light which is absorbed by the phosphor, such that blue light is absorbed.

Figure 4:
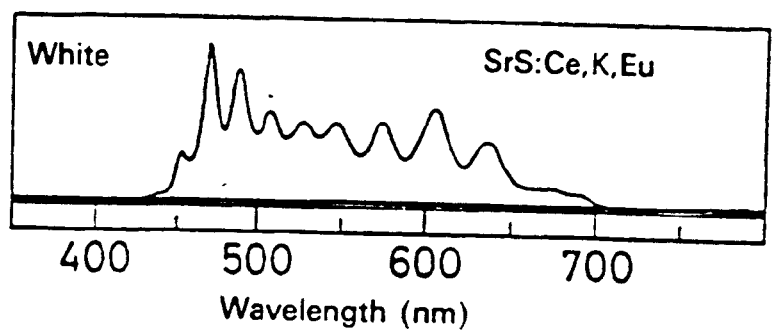
FIG. 4 is an emission spectrum of the phosphor $SrS:Eu^{2+},Ce^{3+},K^+$.

According to another embodiment of the invention, a blue emitting LED is combined with a white emitting phosphor to produce white light. An example of a white-emitting phosphor is $SrS:Eu^{2+},Ce^{3+},K^+$, which, as shown in FIG. 4, has a broad emission. $SrS:Eu^{2+},Ce^{3+},K^+$ can be used to generate white light with a suitable excitation, e.g. a blue LED emitting at about 425–430 nm, wherein the red part of the spectrum is provided by $SrS:Eu^{2+}$ and the blue-green part of the spectrum by $SrS:Ce^{3+}$. According to another embodiment of the invention, a blue emitting LED is combined with a yellow phosphor and a red phosphor to produce white light. Typically, the yellow phosphor has an emission peak of about 570–590 nm, and the red phosphor has an emission peak of about 600–650 nm. The first phosphor may comprise yttrium-aluminum-garnet doped with trivalent cerium ($Y_3Al_5O_{12}:Ce^{3+}$), for example, which emits a relatively broad yellow spectrum having an emission peak at about 580 nm and a full width half maximum value of about 160 nm. The second phosphor emits red light and may comprise at least one of the above-described red phosphors, $Y_2O_2S:Eu^{3+},Bi^{3+}$; $YVO_4:Eu^{3+},Bi^{3+}$; $SrS:Eu^{2+}$; $SrY_2S_4:Eu^{2+}$; $CaLa_2S_4:Ce^{3+}$; and $(Ca,Sr)S:Eu^{2+}$.

The red and yellow phosphors are preferably blended in weight ratios such that combined with the blue emission of the LED, they produce suitable white light, e.g., about 45/20 (weight ratio of red to yellow) for white light at about 3000° K; about 42/22 at about 3500° K; about 34/25 at about 4100° K; about 27/25 at about 5000° K; and about 20/25 at about 6500° K.

To apply the phosphor-containing layer to the LED, the red and green or yellow (hereinafter "green/yellow") phosphors or the white phosphor ($SrS:Eu^{2+},Ce^{3+},K^+$) may be dry blended in a suitable blender and then added to a liquid suspension medium or the individual phosphor or phosphors may be added to a liquid suspension, such as the nitrocellulose/butyl acetate binder and solvent solution used in commercial lacquers. Many other liquids including water with a suitable dispersant and thickener or binder, such as polyethylene oxide, can be used. The phosphor-containing suspension is painted or coated or otherwise applied on the LED and dried. To provide layer 15 (see FIG. 2), the phosphor or phosphors are combined in suitable liquid polymer system, such as polypropylene, polycarbonate, or polytetrafluoroethylene, which is then coated or applied to the LED and dried, solidified, hardened, or cured. The liquid polymer system may optionally be UV (ultraviolet) cured or room temperature cured, to minimize any heat damage to the LED. The clear polymer lens 16 made of suitable plastic such as polycarbonate or other rigid transparent plastic is then molded over the coated LED. Lens 16 may be further coated with anti-reflective layers to facilitate light escaping the device.

The total thickness of the phosphor coating should be such as to absorb most of the blue radiation while allowing some blue radiation to penetrate, or get through, to give the desired color or white light.

Less preferably the green/yellow phosphor may be coated on the LED in a separate layer from the red phosphor layer (the layers together forming a green/yellow and red phosphor-containing covering), although the total amounts of green/yellow and red phosphors will preferably not change from the amounts noted above.

Upon application of a current, the LED produces a blue light, at least a portion of which is converted to red light and green/yellow light. The combination of blue, red, and green/yellow light produces a pleasing white light having a preferred combination of parameters such as a color temperature of between 3000° K and 6500° K, a CRI of greater than 70, typically greater than 80, e.g. between about 83 and 87, and a device luminous efficacy of 10–20 lumens per watt of input electric power.

A preferred phosphor-coated LED of this invention provides 11 lumens per watt at a color temperature of 5000° K with a blue LED that is 4% efficient. As the LED efficiency increases, the lumens per watt of the invented device increases proportionately. The present invention optimizes luminous efficiency, analogous to a triphosphor fluorescent lamp. The present invention, when energized, produces white light similar to a triphosphor fluorescent lamp. The red and green/yellow components are provided by the red and green/yellow phosphors or by the white phosphor ($SrS:Eu^{2+},Ce^{3+},K^+$); the blue component is provided by the blue LED.

Figure 3:
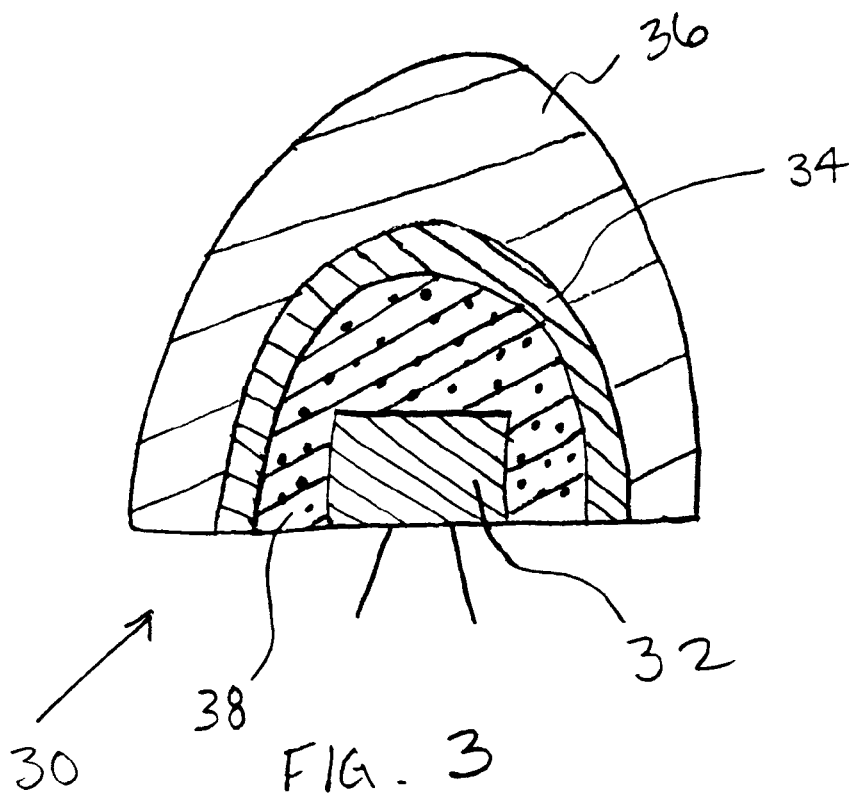
FIG. 3 is a schematic elevational view of a cross section of a lamp which includes a laser diode and a phosphor composition according to another embodiment of the invention.

FIG. 3 illustrates yet another embodiment of a light emitting device 30 which includes a blue-emitting laser diode 32, a transmissive body 36, and a phosphor layer 34. The blue-emitting laser diode 32 typically has an emission peak at 420–470, more typically 430–460, more typically 440–450 nm, with a full width at half maximum typically less than 10 nm, more typically less than 5 nm. Blue laser diodes are known in the art. See, for example, U.S. Pat. Nos.

5,583,879, 5,604,763, and 5,644,584 and Shuji Nakamura and Gerhard Fasol, "The Blue Laser Diode" (1997). The transmissive body 36 may be formed of a suitable plastic such as polycarbonate or other rigid transparent plastic or a silicone material, for example. The transmissive body 36 may be clear or may be a diffuse body which scatters light passing through it. The phosphor layer 34 comprises a white phosphor or a red phosphor and a green/yellow phosphor, as described above, which efficiently absorb blue light from the laser diode.

The light emitting device 30 may also include a plurality of scattering particles 38 which are embedded in a transmissive material comprising, for example, a glass or a polymer or a silicone material. The scattering particles may comprise $Al_2O_3$ particles such as CR30 alumina powder available from Baikowski or $TiO_2$ particles, for example. The particles 38 effectively scatter the coherent light emitted from the laser diode 32, preferably with a negligible amount of absorption. The coupling of the diffuse scattered laser light with the phosphor material is advantageous in reducing optical saturation effects and physical damage of the phosphor material.

Although the preferred embodiments of the invention have been shown and described, it should be understood that various modifications may be resorted to without departing from the scope of the invention as disclosed and claimed herein.

What is claimed is:

1. A light-emitting device comprising a blue-emitting LED covered with a phosphor-containing covering, said phosphor-containing covering containing a green-emitting phosphor and a red-emitting phosphor; said green and red phosphors being excitable by said blue-emitting LED, said green and red phosphors absorbing radiation having a first spectrum emitted by said LED; said green phosphor emitting radiation having a second spectrum; said red phosphor emitting radiation having a third spectrum; said green phosphor having a composition comprising at least one compound selected from the group consisting of $YBO_3:Ce^{3+},Tb^{3+}$;

$BaMgAl_{10}O_{17}:Eu^{2+},Mn^{2+}$; and $(Sr,Ca,Ba)(Al,Ga)_2S_4:Eu^{2+}$; and said red phosphor having a composition comprising at least one compound selected from the group consisting of:

$Y_2O_2S:Eu^{3+},Bi^{3+}$;

$YVO_4:Eu^{3+},Bi^{3+}$;

$SrS:Eu^{2+}$;

$SrY_2S_4:Eu^{2+}$;

$CaLa_2S_4:Ce^{3+}$; and $(Ca,Sr)S:Eu^{2+}$.

2. A device according to claim 1, said blue emitting LED having an emission peak at 420–470 nm with a full width at half maximum of not more than 70 nm.

3. A device according to claim 2, said green phosphors having an emission peak at 530–555 nm with a full width at half maximum of not more than 35 nm, said red phosphors having an emission peak at 610–625 nm with a full width at half maximum of not more than 20 nm.

4. A device according to claim 3, said device when energized producing white light and having a CRI greater than 70.

5. A device according to claim 4, further comprising a clear polymer lens over said phosphor-containing covering.

6. A device according to claim 3, said device when energized having a CRI greater than 80.

7. A device according to claim 3, said red phosphors having an emission peak at about 611 nm.

8. A device according to claim 7, said green phosphors having an emission peak at about 545 nm.

9. A device according to claim 1, said green phosphors having an emission peak at 530–555 nm with a full width at half maximum of not more than 35 nm.

10. A device according to claim 1, said red phosphors having an emission peak at 610–625 nm with a full width at half maximum of not more than 20 nm.

11. A light-emitting device according to claim 1 wherein the green and red emitting phosphors each has a full width half maximum value of less than 60 nm.

12. The light emitting device of claim 11, wherein the green emitting phosphor has a peak emission at about 510–560 nm, and the red emitting phosphor has a peak emission at about 600–630 nm.

13. The light emitting device of claim 11, wherein the red emitting phosphor has a full width half maximum value of less than about 5 nm.

* * * * *